(12) United States Patent
Kuse et al.

(10) Patent No.: US 8,298,890 B1
(45) Date of Patent: Oct. 30, 2012

(54) CHARGE BLOCKING LAYERS FOR NONVOLATILE MEMORIES

(75) Inventors: Ronald John Kuse, Dublin, CA (US); Monica Sawkar Mathur, San Jose, CA (US); Wen Wu, Pleasanton, CA (US)

(73) Assignee: Intermolecular, Inc., San Jose, CA (US)

( * ) Notice: Subject to any disclaimer, the term of this patent is extended or adjusted under 35 U.S.C. 154(b) by 473 days.

(21) Appl. No.: 12/553,918

(22) Filed: Sep. 3, 2009

(51) Int. Cl.
 *H01L 21/336* (2006.01)
(52) U.S. Cl. ........ 438/257; 438/211; 438/593; 438/972; 257/239; 257/261; 257/298; 257/E21.179; 257/E21.495
(58) Field of Classification Search .................. 438/211, 438/257, 593, 972, FOR. 203; 257/239, 257/261, 298, 314, 317, E21.179, E21.495
See application file for complete search history.

(56) References Cited

U.S. PATENT DOCUMENTS

| | | | |
|---|---|---|---|
| 6,642,573 B1 | 11/2003 | Halliyal et al. | |
| 7,262,098 B2 | 8/2007 | Alessandri et al. | |
| 7,382,017 B2 | 6/2008 | Duan et al. | |
| 2007/0032091 A1 | 2/2007 | Heald et al. | |
| 2008/0150009 A1 | 6/2008 | Chen | |
| 2009/0101965 A1 | 4/2009 | Chen et al. | |
| 2009/0212351 A1* | 8/2009 | Chen ........................... | 257/324 |

OTHER PUBLICATIONS

Cho et al., Hf-silicate Inter-Poly Dielectric Technology for sub 70 nm Body Tied FinFET Flash Memory, 2005 Symposium on VLSI Technology Digest of Technical Papers, pp. 208-209.
Del Vitto et al., A morphological, chemical and electrical study of HfSiON films properties for Interpoly Dielectric applications in Flash Memories, Abstract.
Erlbacher et al., Hafnium silicate as control oxide in non-volatile memories, Microelectronic Engineering, 84 (2007) 2239-2242.
Erlbacher et al., HfSiO/SiO2—and SiO2/HfSiO/SiO2-gate stacks for non-volatile memories, Thin Solid Films, 516 (2008) 7727-7731.
Miranda et al., Reliability Comparison of Al2O3 and HfSiON for use as Interpoly Dielectric in Flash Arrays, IEEE 1-4244-0301-4/06 pp. 234-237.
Govorneau et al., Scaling down the interpoly dielectric for next generation Flash memory: Challenges and opportunities, Solid-State Electronics, 49 (2005) 1841-1848.

* cited by examiner

*Primary Examiner* — Thanh V Pham

(57) ABSTRACT

A semiconductor memory element is described, including a substrate including a source region, a drain region, and a channel region, a tunnel oxide over the channel region of the substrate, a charge storage layer over the tunnel oxide, a charge blocking layer over the charge storage layer, and a control gate over the charge blocking layer. The charge blocking layer further includes a first layer including a transition metal oxide, a second layer including a metal silicate, a third layer including the transition metal oxide of the first layer.

11 Claims, 7 Drawing Sheets

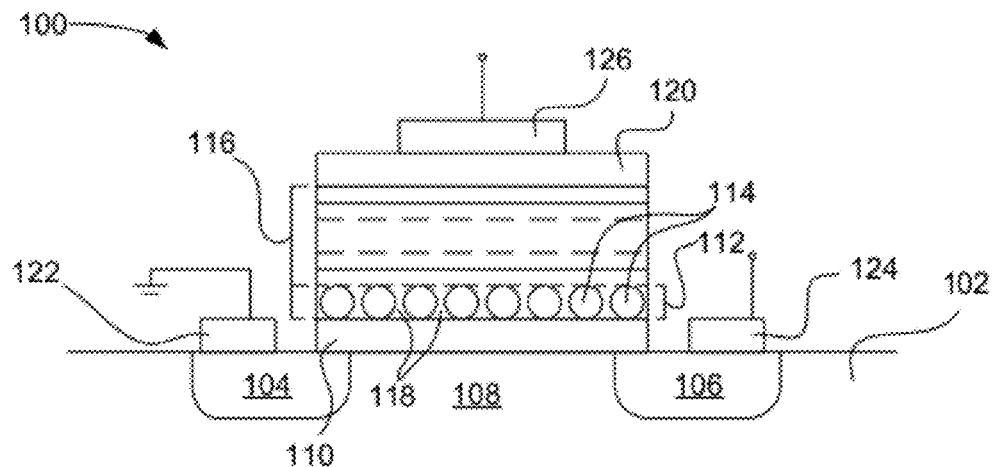
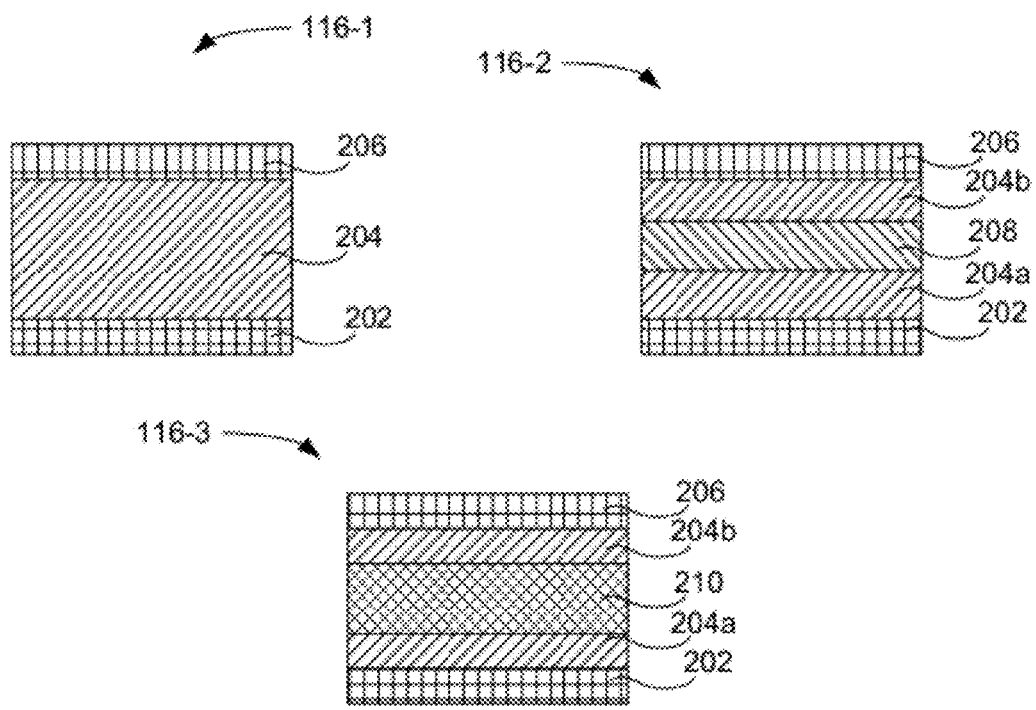
FIG. 1
FIG. 2

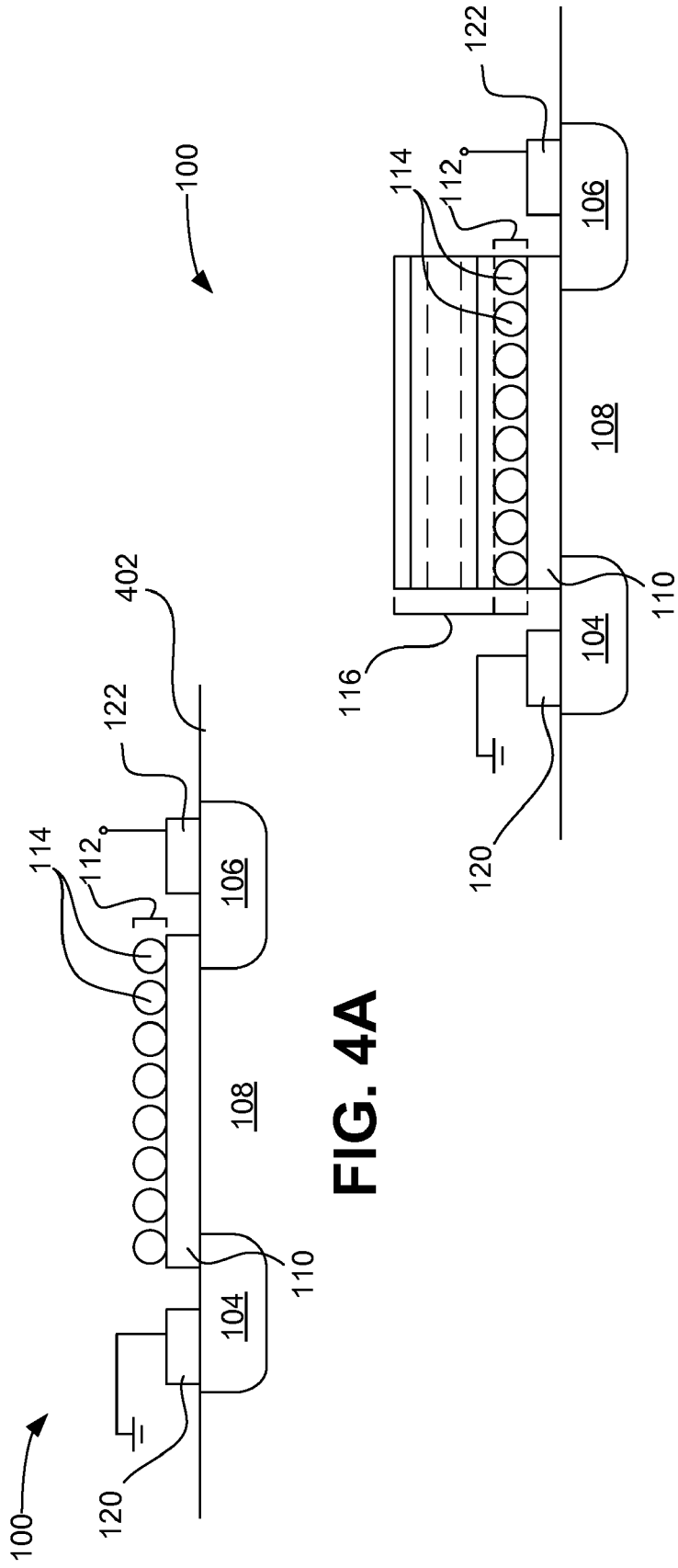

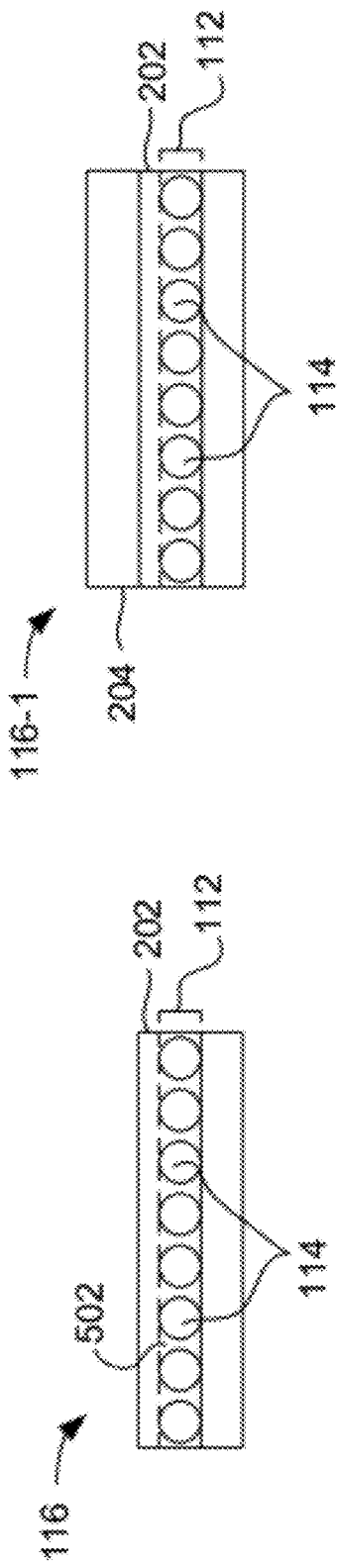
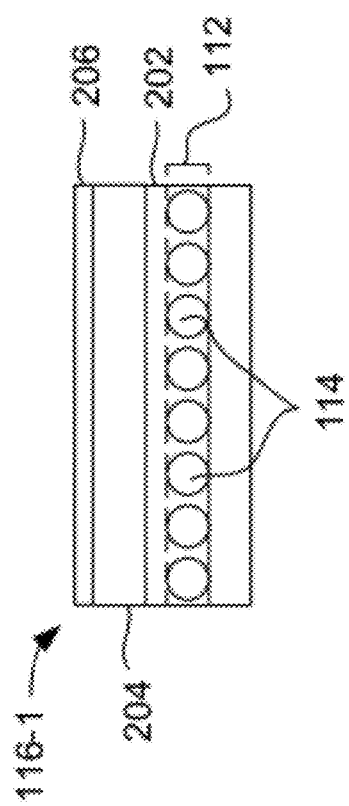

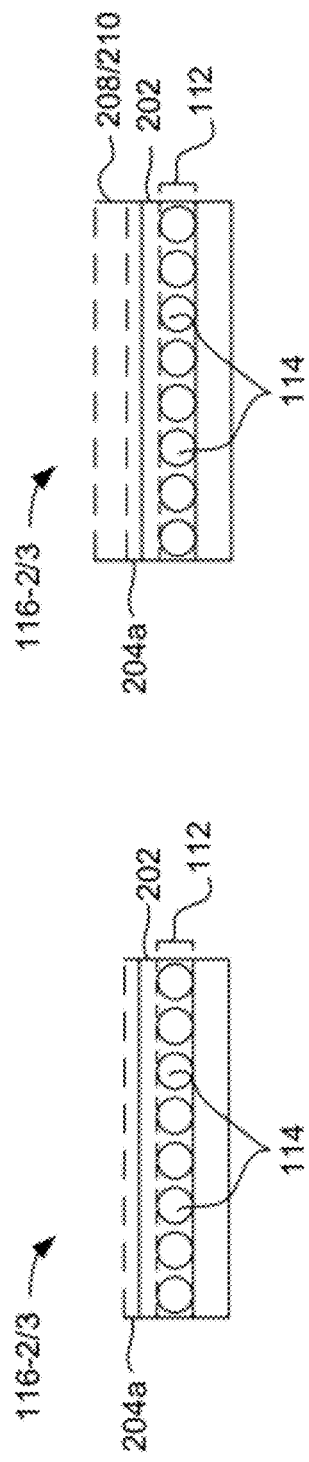
FIG. 5D
FIG. 5E
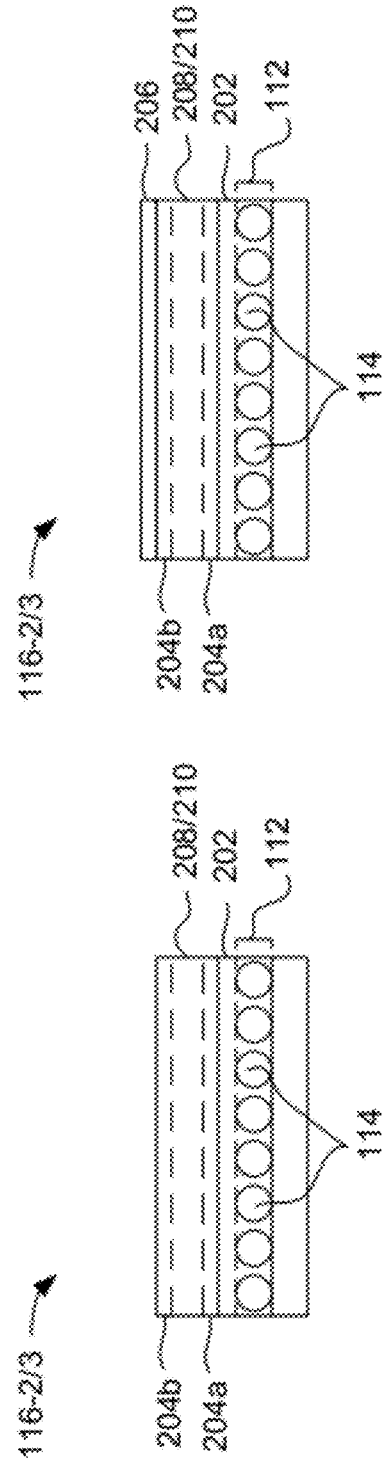
FIG. 5F
FIG. 5G

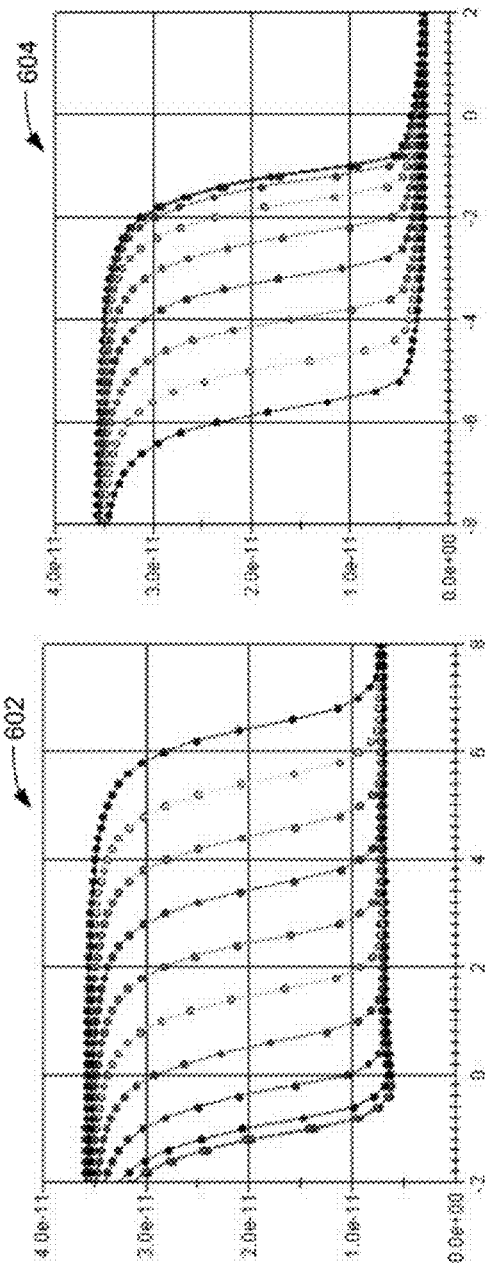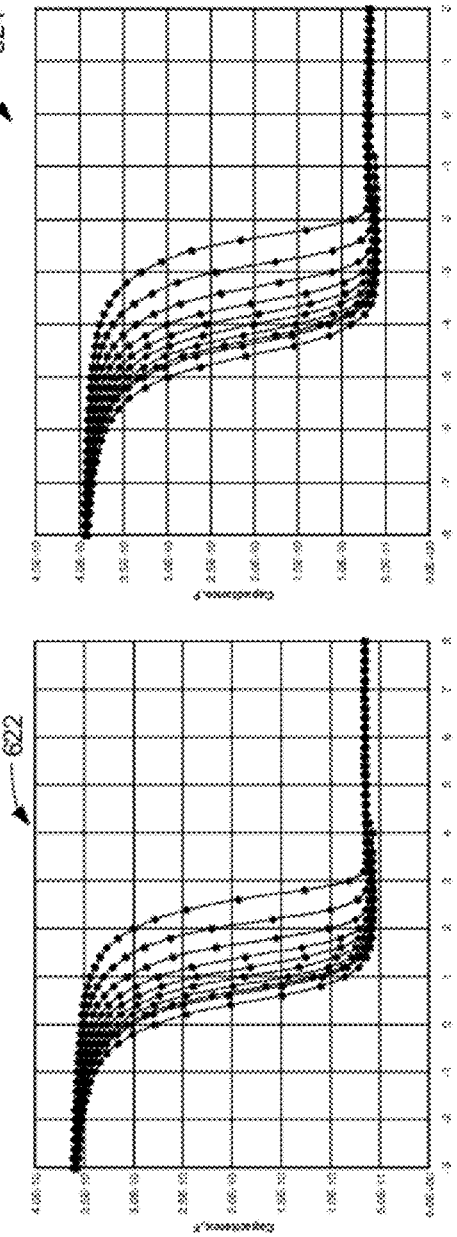
FIG. 6A
FIG. 6B

CHARGE BLOCKING LAYERS FOR NONVOLATILE MEMORIES

FIELD OF THE INVENTION

The present invention relates generally to semiconductor memories. More specifically, charge blocking layers for nonvolatile memories are described.

BACKGROUND OF THE INVENTION

Nonvolatile memories are semiconductor memories that retain their contents even when unpowered. Flash memory is a type of nonvolatile memory that can be electronically erased and programmed. A flash memory device stores data on a charge storage layer (also known as a floating gate), which can be programmed and erased using an adjacent control gate.

The control gate is separated from the charge storage layer by an insulating layer known as a charge blocking layer. The charge blocking layer prevents charge from leaking off of the charge storage layer and into the control gate, adjacent cells, or contact lines, thereby improving memory retention. The charge blocking layer may be a high dielectric constant (high-K) layer, for example.

Various material systems have been used for charge blocking layers. One of the most common materials is a composite layer including a layer of silicon nitride ($Si_3N_4$) surrounded by two layers of silicon dioxide ($SiO_2$). This composite is also known as an oxide-nitride-oxide, or ONO layer. ONO layers provide good charge blocking characteristics, but may not have a sufficiently high dielectric constant or other characteristics necessary for smaller size (e.g. ~40 nm or less) memories.

Thus, what is needed is a charge blocking layer that is tailorable to smaller memories.

BRIEF DESCRIPTION OF THE DRAWINGS

Various embodiments of the invention are disclosed in the following detailed description and the accompanying drawings:

FIG. 1 illustrates a memory element that may be, for example, a transistor or a flash memory transistor structure;

FIG. 2 illustrates several embodiments of a charge blocking layer;

FIGS. 4A-4B and 5A-5G illustrate the process described in FIG. 3 for making the memory element including the charge blocking layer; and FIGS. 6A-6D show P/E windows and retention data for memory devices including charge blocking layers described herein.

DETAILED DESCRIPTION

Figure 3:
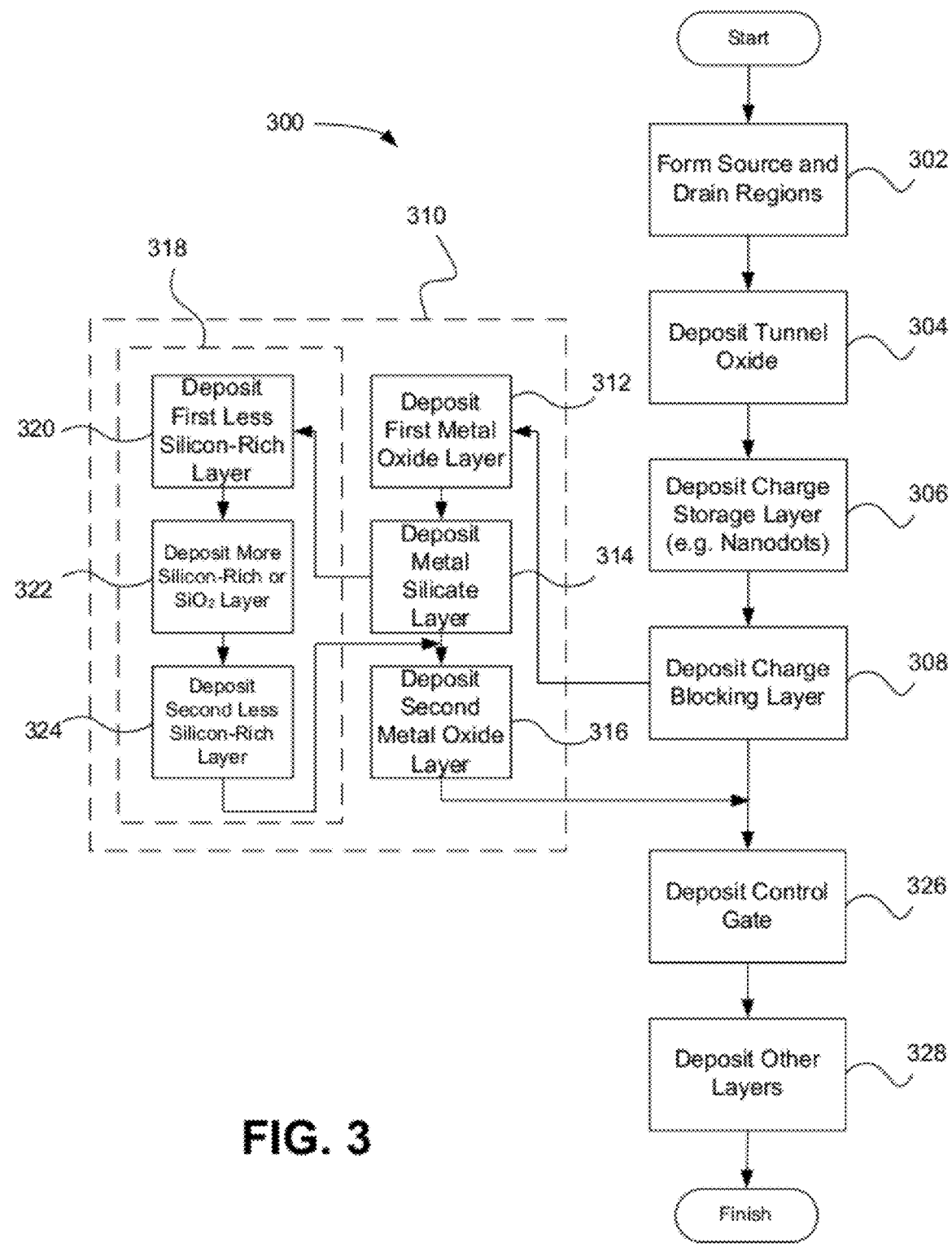
FIG. 3 is a flowchart describing a process for making a nonvolatile memory element including a charge blocking layer.

A detailed description of one or more embodiments is provided below along with accompanying figures. The detailed description is provided in connection with such embodiments, but is not limited to any particular example. The scope is limited only by the claims and numerous alternatives, modifications, and equivalents are encompassed. Numerous specific details are set forth in the following description in order to provide a thorough understanding. These details are provided for the purpose of example and the described techniques may be practiced according to the claims without some or all of these specific details. For the purpose of clarity, technical material that is known in the technical fields related to the embodiments has not been described in detail to avoid unnecessarily obscuring the description.

According to various embodiments, a charge blocking layer for a nonvolatile memory is described. The charge blocking layer is positioned in between a charge storage layer (i.e. a floating gate) and a control gate in a flash-type memory to prevent charge from leaking off of the charge storage layer into the control gate. The charge blocking layer described herein includes multiple layers. A first layer includes a transition metal oxide, such as an oxide of a group IV element, hafnium oxide, or zirconium oxide. The second layer includes a metal silicate, which can also be a transition metal silicate, such as a silicate of a group IV element, hafnium silicate, or zirconium silicate. In some examples, the most prevalent metal of the metal silicate layer is the same as the most prevalent metal of the first metal oxide layer (e.g. the metal could be hafnium and the layers could be hafnium oxide and hafnium silicate). A third layer includes the metal oxide of the first layer.

The second layer, which includes the metal silicate, can further include multiple sublayers. In a first example, the second layer includes three sublayers. The first and third sublayers have an atomic proportion of silicon to metal that is approximately 1.5 parts silicon to 1 part metal. The second sublayer, which is in between the first and third sublayers, is more silicon-rich, and has a proportion of silicon to metal that is greater than 2 parts silicon to 1 part metal. In a second example, the second sublayer is silicon oxide.

I. Memory Element Structure

FIG. 1 illustrates a memory element 100. Memory element 100 may be, for example, a transistor or a flash memory transistor structure. Memory element 100 can be a flash-type memory element that retains charge on a charge storage layer and uses a control gate to program and erase the memory element 100. Memory element 100 includes a substrate 102 that has a doped source region 104 and a doped drain region 106, and a channel region 108. A tunnel oxide 110 (e.g. $SiO_2$) is formed over the channel region 108.

A charge storage layer 112 is formed over the tunnel oxide. The charge storage layer 112 is used by the memory element 100 to store and release charge, which reflects the data stored by the memory element 100. For example, by increasing the amount of charge on the charge storage layer 112, the state of the memory element 100 can change from 0 to 1, and by reducing the amount of charge in the charge storage layer 112, the state of the memory element 100 can change from 1 to 0. In some embodiments, the charge storage layer 112 is a monolayer of nanodots 114 (or quantum dots), which are nanocrystals that are between 1 and 100 nm. The nanodots 114 are conductive materials that can be electrically isolated from one another. The nanodots 114 are, in some embodiments, silicon or a high work function material (i.e. >4.5 eV) material such as ruthenium. In other embodiments the nanodots 114 may be formed from Pd, Jr, Ni, Pt, Au, Co, W, Te, Re, Mo, FePt alloy, Ta, TaN, Ni Silicide or other conductive materials.

Nanodots can be formed using CVD, ALD, PVD or other dry deposition techniques. Wet techniques can also be used for deposition. Alternatively, the nanodots 114 can be a quantum dot that is a preformed colloidal metal, semiconductor, or dielectric. Quantum dots can be deposited using spin coating, spray coating, printing, etc. Other examples can include charge storage layers 112 made from conventional materials such as doped polysilicon instead of nanodots 114.

A charge blocking layer 116 is deposited over the charge storage layer 112. As is shown in FIG. 2, the charge blocking layer 116 may be comprised of several other layers, and may include different materials. Generally, the charge blocking layer 116 prevents charge from leaking out of the charge storage layer 112 into the control gate 120, adjacent cells, or contact lines, and therefore increases memory retention. The charge blocking layer 116 may, if nanodots 114 are used, fill in gaps 118 between the nanodots 114. Alternatively, the gaps 118 can be filled with another material (e.g. silicon dioxide) that is separate from the layers of the charge blocking layer 116.

A control gate 120 is deposited over the charge blocking layer 116. The control gate can be doped polysilicon or another conductive material, for example. The memory element 100 can further include a source contact 122, a drain contact 124, and a gate contact 126, which may all be conductive materials that are connected as necessary to operate the memory element 100.

II. Charge Blocking Layer
A. Generally

FIG. 2 illustrates several embodiments of the charge blocking layer 116. The charge blocking layer 116 includes several layers. For example, the charge blocking layer 116-1 includes three layers, while the charge blocking layers 116-2 and 116-3 include five layers. Several layers and different materials are used because the charge blocking layer 116 is tailored to meet several different requirements.

Generally, the charge blocking layer 116 should have an equivalent oxide thickness (EOT) that provides a sufficiently high capacitance to trap charge in the charge storage layer 112, while having a physical thickness that provides an adequate coupling ratio between the tunnel oxide 110 and the charge blocking layer 116.

The equivalent oxide thickness (EOT) of a layer is a measurement of how thick a silicon oxide film would need to be to equal the capacitance of the layer. For example, a 30 nm thick layer may have an EOT of 8 nm, which would indicate that a silicon oxide layer that is 8 nm thick would have the same capacitance as the 30 nm layer.

The gate coupling ratio is the ratio between the control gate 120 to floating gate (i.e. the charge blocking layer 112) capacitance and the total floating gate to source, drain, and substrate capacitance. The gate coupling ratio needs to be within a certain range depending on the device. For example, some flash devices require a gate coupling ratio of between 0.6 and 0.7. Additionally, low leakage is desirable to increase memory retention. To this end, materials with a higher conduction band offsets (CBO) between each other can be used to control leakage.

Compound material stacks (i.e. stacks including layers of different materials) may fit these criteria. For example, materials including metal oxides and metal silicates have showed improved results over ONO and other conventional charge blocking layers when program/erase voltages and retention testing are considered (see FIGS. 6A-6D). Using the silicate material can improve leakage characteristics, but the metal oxide material can be helpful in obtaining the desired EOT while maintaining the desired thickness.

The charge blocking layer 116-1 includes three layers: 202, 204, and 206. The layers 202 and 206 are metal oxides, and the layer 204 is a metal silicate. In some embodiments, the metals are transition metals, group IV metals, hafnium, zirconium, or hafnium doped zirconium.

The charge blocking layer 116-2 includes five layers: 202, 204a, 204b, 206, and 208. The layers 202 and 206 are metal oxides, and the layers 204a, 204b, and 208 are metal silicates. The layer 208 is more silicon-rich than the layers 204a and 204b. For example, the atomic ratio of silicon to metal may be approximately 1.5:1 in the layers 204a and 204b, but may be greater than 2:1 in the layer 208.

The charge blocking layer 116-3 also has five layers 202, 204a, 204b, 206, and 210. The layer 210 is a silicon oxide ($SiO_2$) layer. The layers 202 and 206 are metal oxide layers, and the layers 204a and 204b are metal silicate layers. In some embodiments, the layers 204a, 204b, and 208/210 can be considered "sublayers" of the silicate or Si-containing layer 204.

In some embodiments, the metal oxide layers 202 and 206 and the metal silicate layers 204, 204a, 204b, and 210 may contain the same metal. For example, the metal oxide layers may be hafnium oxide or zirconium oxide while the metal silicate layers are hafnium silicate or zirconium silicate.

B. Material Selection Criteria

The charge blocking layers 116 can be tailored to provide various characteristics, including a desired EOT (e.g. 7-8 nm) and low leakage. To achieve these goals, metal oxides and metal silicates can be used in a layer stack to combine the benefits of using both types of materials. Certain metal oxides, for example, hafnium or zirconium oxide, have high dielectric constants that can be useful for obtaining a desired EOT.

Metal silicates, for example hafnium silicate or zirconium silicate, have properties different from metal oxides that can be advantageous. Hafnium silicate, for example, has a higher crystallization temperature than hafnium oxide, and can form a stable amorphous phase. The amorphous phase of the silicate is more resistant to oxygen diffusion, which can promote stability of the oxide/silicate/oxide stacks described herein. Amorphous layers also generally have a higher dielectric constant than crystalline layers, so the amorphous phase of the silicates can advantageously increase the capacitance of the charge blocking layer 116. Additionally, the silicate has beneficial (i.e. high) bandgap properties that can reduce leakage through the charge blocking layers.

Metal silicates and metal oxides can be therefore be combined to form an oxide/silicate/oxide stack that has the desired EOT while maintaining the desired physical thickness.

C. Examples

In some examples, a charge blocking layer may include a first layer including a transition metal oxide, a second layer including a transition metal silicate, and a third layer including a transition metal oxide. The first and third layers may have the same most prevalent metal, for example hafnium or zirconium. The second layer can have the same as the most prevalent metals in the first and third layers (the metal oxide layers), for example hafnium or zirconium. In some examples, the metals can be transition metals, group IV metals, hafnium, zirconium, or hafnium-doped zirconium.

Generally, the metal oxides and metal silicates are high-K (i.e. high dielectric constant) materials that are selected to have an equivalent oxide thickness (EOT) that gives a good program/erase (P/E) window and good data retention characteristics.

Examples of material stacks include transition metal based systems, group IV-element based systems, hafnium-based systems and zirconium-based systems. For example, a charge blocking layer of the type 116-1 may include a hafnium oxide layer 202, a hafnium silicate layer 204 (e.g. $Hf_{0.4}Si_{0.6}O_2$), and another hafnium oxide layer 206. A target EOT can be chosen, for example, 7-8 nm, and the total actual thickness of the layer would then be approximately 30 nm. In such a layer for example, the hafnium oxide layers 202 and 206 may be between 1 and 4 nm, or between 2 and 3 nm thick, and the hafnium silicate layer 204 can be between 10 and 20 nm, or between 12 and 15 nm thick.

Other examples include a charge blocking layer of the type 116-2, which includes three silicate layers 204a, 204b, and 208. The layers 204a and 204b include a silicate having a proportion of silicon to metal that is approximately 1.5:1 (e.g. $Hf_{0.4}Si_{0.6}O_2$), while the layer 208, which is in between the layers 204a and 204b, is more silicon-rich, and has a proportion of silicon to metal that is greater than 2:1 (e.g. $Hf_{0.3}Si_{0.7}O_2$). A target EOT can be chosen, for example, 7-8 nm, and the total actual thickness of the layer would then be approximately 30 nm. In such a layer for example, the hafnium oxide layers 202 and 206 may be between 1 and 4 nm, or between 2 and 2.7 nm thick, the less-silicon rich hafnium silicate layers 204a and 204b can be between 3 and 7 nm, or between 4 and 4.5 nm thick, and the more-silicon rich hafnium silicate layer 208 can be between 3 and 10 nm, or 3.7 and 6.7 nm thick.

Another example include a charge blocking layer of the type 116-3, which includes two silicate layers 204a and 204b, and a silicon dioxide layer 210. The layers 204a and 204b include a silicate having a proportion of silicon to metal that is approximately 1.5:1 (e.g. $Hf_{0.4}Si_{0.6}O_2$). The EOT can be selected as desired, the EOT can be 7-8 nm, and the total actual thickness of the layer would then be approximately 30 nm. In such a layer for example, the hafnium oxide layers 202 and 206 may be between 1 and 4 nm, or between 2 and 2.7 nm thick, the less-silicon rich hafnium silicate layers 204a and 204b can be between 3 and 7 nm, or between 4 and 4.5 nm thick, and the more-silicon rich hafnium silicate layer 208 can be between 3 and 10 nm, or 3.7 and 6.7 nm thick.

Although hafnium oxide and hafnium silicate systems have been described above, it is understood that zirconium silicate and zirconium oxide can be used in their place. For example, a charge blocking layer 116 can include a zirconium oxide/zirconium silicate/zirconium oxide stack, a zirconium oxide/hafnium silicate/zirconium oxide stack, or a hafnium oxide/zirconium silicate/hafnium oxide stack. Additionally, the zirconium silicate layers can have more and less silicon-rich sublayers, for example the zirconium silicate layers in the stacks above could be $Zr_{0.4}Si_{0.6}O_2/Zr_{0.3}Si_{0.7}O_2/Zr_{0.4}Si_{0.6}O_2$ or $Zr_{0.4}Si_{0.6}O_2/SiO_2/Zr_{0.4}Si_{0.6}O_2$.

Other examples of materials systems are shown in Table 1:

III. Process for Making Nonvolatile Memory Including Charge Blocking Layer

FIG. 3 is a flowchart describing a process 300 for making a nonvolatile memory element 100 including a charge blocking layer 116. FIGS. 4A-4B and 5A-5G illustrate the process 300 for making the nonvolatile memory element 100 including the charge blocking layer 116.

FIG. 4A illustrates the memory device 100 before the charge blocking layer 116 is deposited. The process 300 is performed on a substrate 402 (e.g. a silicon substrate) to form a transistor-type structure (e.g. a flash transistor) that can be used to form a nonvolatile memory element. In operation 302, source 104 and drain 106 regions are formed in the substrate 402 using, for example, ion implantation. In operation 304, a tunnel oxide layer (e.g. silicon oxide) 110 is deposited over the channel region 108.

In operation 306, the charge storage layer 112 is deposited. The charge storage layer 112 can be made of nanodots 114, for example. Nanodots 114 may, in some embodiments, be a high work function metal (e.g. Ru), and be smaller than 5 nm. The nanodots 114 can be created using known processes such as chemical vapor deposition (CVD), ALD, or physical vapor deposition (PVD).

In operation 308, a charge blocking layer 116 is deposited. FIG. 4B illustrates the charge blocking layer 116 deposited over the charge storage layer 112. FIGS. 5A-5G illustrate depositing the individual layers that comprise the charge blocking layer 116. The process 310 that describes the deposition of the individual layers is described in operations 312-316 and process 318 (which includes operations 320-324). Generally, the charge blocking layer includes three layers (202, 204, and 206). The layer 204 may be a silicate layer and may further include three sublayers (e.g. 204a, 204b, 208/210) that have different amounts of silicon.

Two basic charge-blocking layers 116 are described herein: a charge blocking layer 116-1 that includes three layers, and charge blocking layers 116-2 and 116-3 that include five layers. The formation of the charge blocking layer 116-1 is shown in FIGS. 5A-5C and described in operations 312-316, and the formation of the charge blocking layers 116-2 and 116-3 (collectively 116-2/3) is shown in FIGS. 5A and 5D-5G, and described in operations 312-316 and 320-324.

To form the 3-layer charge blocking layer 116-1, a first metal oxide layer 202 is deposited over the charge storage

TABLE 1

| System No. | First Layer | | Second Layer | | Third Layer | | Fourth Layer | | Fifth Layer | |
|---|---|---|---|---|---|---|---|---|---|---|
| | Material | Thickness (nm) | Material | Thickness (nm) | Material | Thickness (nm) | Material | Thickness (nm) | Material | Thickness (nm) |
| 1 | $HfSi_xO_y$ | 5-7 | $HfO_2$ | 4-6 | $HfSi_xO_y$ | 5-7 | | | | |
| 2 | $SiO_2$ | 2.5-4.5 | $HfAl_xO_y$ | 2-3 | $SiO_2$ | 2.5-4.5 | | | | |
| 3 | $SiO_2$ | 2.5-4.5 | $HfSi_xO_y$ | 2-3 | $SiO_2$ | 2.5-4.5 | | | | |
| 4 | $AlSi_xO_y$ | 4.5 | $HfO_2$ | 3 | $AlSi_xO_y$ | 4.5 | | | | |
| 5 | $HfO_2$ | 1.5-3 | $HfAl_xO_y$ | 14-17 | $HfO_2$ | 1.5-3 | | | | |
| 6 | $HfSi_xO_y$ | 3-5 | $HfAl_xO_y$ | 2.5-3.5 | $HfSi_xO_y$ | 3-5 | | | | |
| 7 | $HfO_2$ | 1.5-3 | $SiO_2$ | 2-5 | $HfO_2$ | 1.5-3 | $SiO_2$ | 2-5 | $HfO_2$ | 1.5-3 |
| 8 | $SiO_2$ | 2-7 | $HfSi_xO_y$ | 2-3 | $HfO_2$ | 2.5-3 | $HfSi_xO_y$ | 2-3 | $SiO_2$ | 2-7 |
| 9 | $SiO_2$ | 2-4 | $HfO_2$ | 2-2.5 | $HfSi_xO_y$ | 2.5-3 | $HfO_2$ | 2-2.5 | $SiO_2$ | 2-4 |
| 10 | $HfO_2$ | 2-3 | $HfSi_xO_y$ | 5-6 | $HfO_2$ | 2-3 | $SiO_2$ | 4-5 | | |

As shown in table 1, potential materials include metal aluminates and aluminum silicates. As with the other material systems described herein, the material systems shown in table 1 can be designed to have a desired EOT (e.g. 7-8 nm), and the thickness of the materials can be chosen to achieve that EOT.

layer 112 in operation 312. FIG. 5A illustrates the first metal oxide layer 202. The first metal oxide layer 202 can be deposited using any known technique, for example ALD, CVD, or PVD. In one example, the first metal oxide layer 202 is a hafnium oxide layer deposited using ALD, for example using a hafnium precursor (e.g. tetrakis (diethylamido) hafnium (TDEAHf), tetrakis (dimethylamido) hafnium (TDMAHf), tetrakis (ethylmethylamido) hafnium (TEMAHf) or hafnium chloride ($HfCl_4$)) and an oxidant (e.g. ozone, oxygen, water vapor, or oxygen plasma). It is understood that any metal oxide, transition metal oxide, or group IV metal oxide can be used to form the layer.

In operation 314, a metal silicate layer is deposited. FIG. 5B illustrates the metal silicate layer 204 deposited over the first metal oxide layer 202. The metal silicate layer 204 can have any appropriate stoichiometry, and can be deposited using any appropriate process (e.g. ALD, CVD, or PVD). In one embodiment, the metal silicate layer 204 is deposited using ALD with a metal (e.g. hafnium) precursor, a silicon precursor, and an oxidant. Using the ALD process, the metal silicate layer 204 can be deposited using co-injection (i.e. both precursors are injected into the deposition chamber simultaneously) or nanolamination (i.e. the precursors are introduced sequentially, and the layer is annealed to mix the metal and silicon together).

In operation 316, a second metal oxide layer 206 is deposited over the metal silicate layer 204. The second metal oxide layer 206 is shown in FIG. 5C. The second metal oxide layer 206 can be deposited using the same processes as the first metal oxide layer 202 (e.g. CVD, ALD, PVD), and in some embodiments may include a same metal as the first metal oxide layer 202.

If the charge blocking layer 116 is a 5-layer charge blocking layer 116-2/3, the operations 312 and 316 can be used to deposit the metal oxide layers 202 and 206, and the process 318, which includes the operations 320-324 can be used to deposit the metal silicate layers. FIGS. 5A and 5D-5G illustrate the deposition of a 5-layer charge blocking layer.

In operation 312, the first metal oxide layer is deposited, which is shown in FIG. 5A. The operation 312 is the same as above for the 3-layer charge blocking layer. When depositing a 5-layer charge blocking layer 116-2/3, the operation 314 is represented by the process 318, which includes depositing 3 silicate or silicon layers.

In operation 320, a first less silicon-rich layer is deposited. FIG. 5D illustrates a first less silicon-rich layer 204a deposited over the first metal oxide layer 202. The first less silicon-rich layer 204a can be for example, $Hf_{0.4}Si_{0.6}O_2$, or another silicate (e.g. a Zirconium-based silicate). The silicate can be deposited, for example, using ALD and co-injection or nanolamination, or can be deposited using other processes (e.g. CVD using co-injection, PVD, etc.)

In operation 322, a more silicon-rich layer 208, or a silicon oxide layer 210 is deposited over the first less silicon-rich layer 204a. FIG. 5E shows the deposition of the more silicon-rich layer 208 or the silicon dioxide layer 210 over the first less silicon-rich layer 204a. The more silicon-rich layer 208 can be, for example, $Hf_{0.3}Si_{0.7}O_2$ or any other desired stoichiometry. The layers 208 and 210 can be deposited using techniques described above, for example using ALD, CVD, or PVD, and if the layer is a silicate, using co-deposition techniques such as co-injection or nanolamination.

In operation 324, a second less silicon-rich layer 204b is deposited over the layer 208 or 210. FIG. 5F shows the second less silicon-rich layer 204b. The operation 324 is substantially the same as the operation 320. In operation 316, a second metal oxide layer 206 is deposited over the second less silicon-rich layer 204b, which is shown in FIG. 5G.

After the charge blocking layer 116 has been deposited, the remainder of the memory element 100 can be created. In operation 326, a control gate is deposited over the charge blocking layer 116 using known techniques. For example, the control gate may be polysilicon or any appropriate material. In operation 328, other layers, such as a gate contact, can be deposited.

Various modifications and additions or deletions can be made to the process 300 to tailor the process for specific applications. Additionally, the process 300 is an example of a process that can be used for form a memory element including the charge blocking layer 116. It is understood however that various other processes can also be used to form a memory element incorporating the charge blocking layers 116 described herein.

IV. Data
A. Methodology

The efficacy of a charge blocking layer can be determined by examining the program/erase (P/E) window and the erase retention of the charge blocking layer. The P/E window refers to the theoretical gap between the program and erase voltages; a wider gap is better. The erase retention refers to the amount of charge that the charge storage layer stores over time.

The P/E window can be measured by program bias voltage and the erase bias voltage. The program bias voltage is measured by adding charge to the charge storage layer, and plotting the bias voltage versus the capacitance of the charge storage layer as different amounts of charge are added. The erase bias voltage is measured by removing charge from the charge storage layer and plotting the bias voltage versus the capacitance as different amounts of charge are removed. The P/E window is the gap between the highest program bias voltage (i.e. when the most charge is added) and the lowest erase bias voltage (e.g. when the most charge is removed). The larger the gap is, the easier it is to distinguish between two cell states, making the device more reliable and less sensitive to process variations, charge loss, and degradation effects. If the window is sufficiently wide, it enables multi-level cell programming in which more than one bit per cell can be stored, reducing the cost per bit without requiring a smaller cell.

The erase retention can be measured by charging the charge storage layer and baking the device at 250° C. for 1 hour to simulate the passing of time. Bias voltage versus capacitance measurements are taken before and after the baking to determine how much charge is lost over time. The smaller the erase retention shift is, the better the charge blocking layer is at keeping charge on the charge storage layer.

B. Experimental Results

1. $HfO_2/Hf_{0.4}Si_{0.6}O_2/HfO_2$

Charge blocking layers containing a 2-3 nm hafnium oxide layer (e.g. the layer 202), a 12-15 nm $Hf_{0.4}Si_{0.6}O_2$ layer (e.g. the layer 204), and a 2-3 nm hafnium oxide layer (e.g. the layer 206) were formed. The layers were formed using atomic layer deposition (ALD) using a Tetrakis(dimethylamido) hafnium (TDMAH) precursor and were annealed at 950° C. in nitrogen for 60 seconds.

FIG. 6A shows a P/E window for memory devices including the charge blocking layers described above. The program bias is shown in the graph 602 and the erase bias is shown in the graph 604. The P/E window is greater than 12V.

2. $HfO_2/Hf_{0.4}Si_{0.6}O_2/Hf_{0.3}Si_{0.7}O_2/Hf_{0.4}Si_{0.6}O_2/HfO_2$

Charge blocking layers containing a 2-2.7 nm hafnium oxide layer (e.g. the layer 202), a 4-4.5 nm $Hf_{0.4}Si_{0.6}O_2$ layer (e.g. the layer 204b), a 3.7-6.7 nm $Hf_{0.3}Si_{0.7}O_2$ (e.g. the layer 208), a 4-4.5 nm $Hf_{0.4}Si_{0.6}O_2$ layer (e.g. the layer 204a), and a 2-2.7 nm hafnium oxide layer (e.g. the layer 206) were formed. The layers were formed using atomic layer deposition (ALD) using a Tetrakis(dimethylamido)hafnium (TDMAH) precursor and were annealed at 950° C. in nitrogen for 60 seconds. Generally, these charge blocking layers follow the type 116-2, and have a more silicon-rich silicate layer between two less-silicon rich silicon layers. The more silicon-rich silicate layer has a ratio of silicon to hafnium that is approximately 7:3 or greater than 2:1, and the less silicon-rich silicate layer has a ratio of silicon to hafnium that is approximately 1.5:1.

FIG. 6B shows a P/E window for memory devices including the charge blocking layers described above. The program bias is shown in the graph 622 and the erase bias is shown in the graph 624. The P/E window is approximately 8.5V.

3. $HfO_2/Hf_{0.4}Si_{0.6}O_2/SiO_2/Hf_{0.4}Si_{0.6}O_2/HfO_2$

Charge blocking layers containing a 2.7-3 nm hafnium oxide layer (e.g. the layer 202), a 2.4-4.1 nm $Hf_{0.4}Si_{0.6}O_2$ layer (e.g. the layer 204b), a 4.8-6.7 nm $SiO_2$ layer (e.g. the layer 210), a 2.4-4.1 nm $Hf_{0.4}Si_{0.6}O_2$ layer (e.g. the layer 204a), and a 2.7-3 nm hafnium oxide layer (e.g. the layer 206) were formed. The layers were formed using atomic layer deposition (ALD) using a Tetrakis(dimethylamido)hafnium (TDMAH) precursor and were annealed at 950° C. in nitrogen for 60 seconds. Generally, these charge blocking layers follow the type 116-3, having a silicon oxide layer in between two hafnium silicate layers.

Figure 6C:
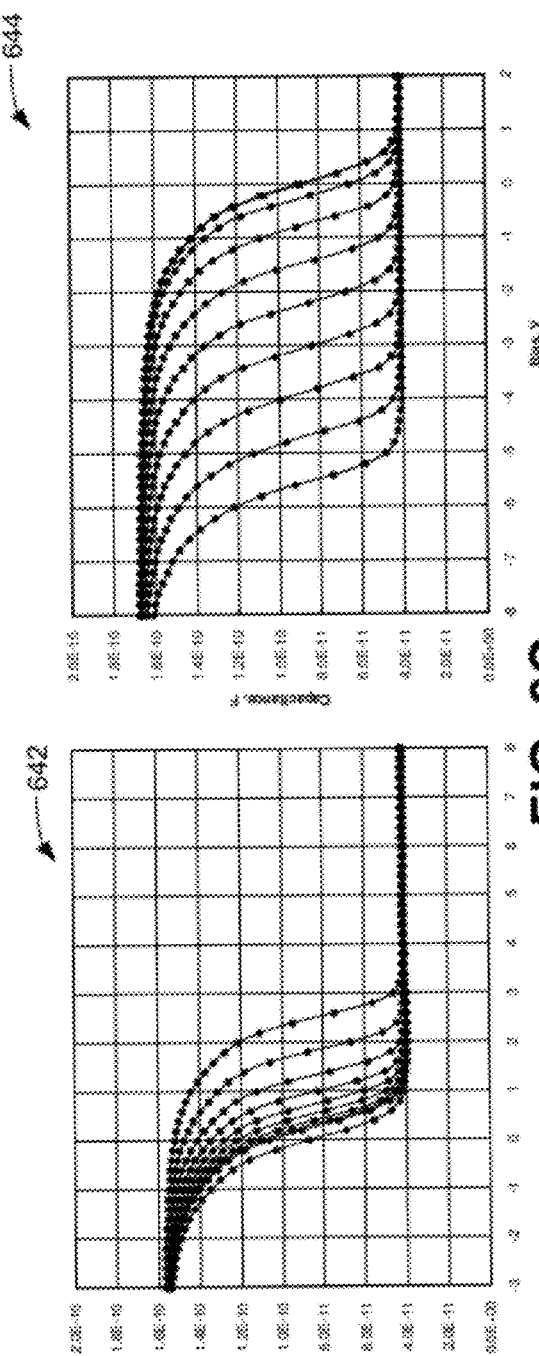

FIG. 6C shows a P/E window for memory devices including the charge blocking layers described above. The program bias is shown in the graph 642 and the erase bias is shown in the graph 644. The P/E window is approximately 8.5V.

Figure 6D:
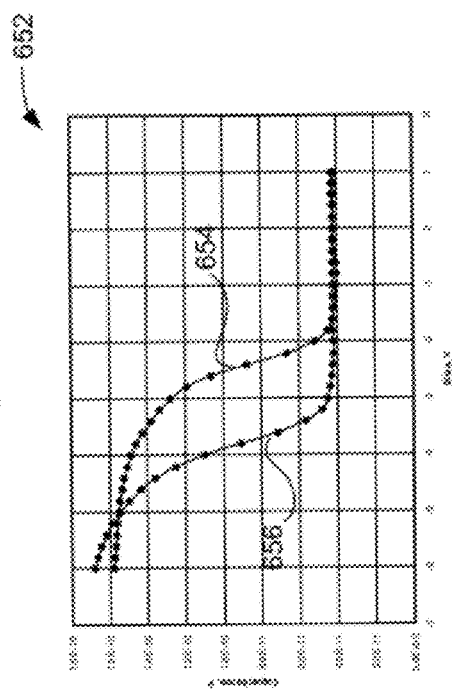

FIG. 6D shows erase retention for memory devices including the charge blocking layers described above. The erase retention is shown in the graph 652; the plot 654 shows bias voltage verses capacitance before baking, and the plot 656 shows bias voltage versus capacitance after baking one hour at 250° C. The samples with the more silicon-rich silicate layer show a retention shift of approximately 1.2 V after one hour of baking.

Although the foregoing examples have been described in some detail for purposes of clarity of understanding, the invention is not limited to the details provided. There are many alternative ways of implementing the invention. The disclosed examples are illustrative and not restrictive.

What is claimed:

1. A method comprising:
    obtaining a substrate including source and drain regions, a tunnel oxide over a channel region of the substrate, and a charge storage layer over the tunnel oxide;
    depositing a charge blocking layer over the charge storage layer, wherein depositing the charge blocking layer comprises depositing a first metal oxide layer comprising a first metal, depositing a first metal silicate layer over the first metal oxide layer, depositing a second metal silicate layer over the first metal silicate layer, depositing a third metal silicate layer over the second metal silicate layer, depositing a second metal oxide layer over the third metal silicate layer, the second metal oxide layer comprising the first metal, the second metal silicate layer being more silicon-rich than the first metal silicate layer and the third metal silicate layer; and
    depositing a control gate over the charge blocking layer.

2. The method of claim 1, wherein depositing the metal silicate layers comprise:
    depositing the first metal silicate layer on the first metal oxide layer, the first metal silicate layer having a first atomic proportion of silicon to metal that is approximately 1.5 parts silicon to 1 part metal;
    depositing the second metal silicate layer on the first metal silicate layer, the second metal silicate layer having a second atomic proportion of silicon to metal that is greater than 2 parts silicon to 1 part metal; and
    depositing the third metal silicate layer on the second metal silicate layer, the third metal silicate layer having the first atomic proportion of silicon to metal.

3. The method of claim 1, wherein the charge blocking layer is deposited using at least one of atomic layer deposition (ALD) and chemical vapor deposition (CVD).

4. The method of claim 1, wherein:
    the first metal comprises at least one of hafnium and zirconium; and
    the metal silicate layers comprise the first metal.

5. The method of claim 1, wherein the charge storage layer comprises nanodots.

6. The method of claim 2, wherein the second metal silicate layer is substantially silicon oxide.

7. The method of claim 1, wherein the metal oxide layers comprise an oxide of a group IV element.

8. The method of claim 1, wherein the metal oxide layers comprise hafnium oxide.

9. The method of claim 1, wherein the first, second and third metal silicate layers and the first and second metal oxide layers all include the first metal.

10. The method of claim 1, wherein the first metal is hafnium.

11. The method of claim 1, wherein:
    the first metal oxide layer is between 1 and 4 nm thick;
    the first metal silicate layer is between 1 and 4 nm thick;
    the second metal silicate layer is between 3 and 10 nm thick;
    the third metal silicate layer is between 1 and 4 nm thick; and
    the second metal oxide layer is between 1 and 4 nm thick.

* * * * *